(12) United States Patent
Chiou et al.

(10) Patent No.: US 6,586,265 B2
(45) Date of Patent: Jul. 1, 2003

(54) METHOD AND APPARATUS OF TOOL MATCHING FOR A SEMICONDUCTOR MANUFACTURING PROCESS

(75) Inventors: Hung-Wen Chiou, Hsinchu (TW); Chia-Chun Tso, Taipei Hsien (TW)

(73) Assignee: Promos Technologies Inc., Hsinchu (TW)

(*) Notice: Subject to any disclaimer, the term of this patent is extended or adjusted under 35 U.S.C. 154(b) by 0 days.

(21) Appl. No.: 09/996,112

(22) Filed: Nov. 27, 2001

(65) Prior Publication Data

US 2003/0022399 A1 Jan. 30, 2003

(30) Foreign Application Priority Data

Jul. 26, 2001 (TW) ..................................... 90118340 A

(51) Int. Cl.[7] ............................................. H01L 21/66
(52) U.S. Cl. ........................................ 438/14; 324/765
(58) Field of Search ............................ 438/14; 357/40; 324/765

(56) References Cited

U.S. PATENT DOCUMENTS 5,128,737 A * 7/1992 Have .............................. 357/40
6,281,696 B1 * 8/2001 Voogel ........................... 324/765

* cited by examiner

Primary Examiner—John F. Niebling
Assistant Examiner—Andre C. Stevenson
(74) Attorney, Agent, or Firm—Ladas & Parry

(57) ABSTRACT

The present invention provides a method of tool matching for a semiconductor manufacturing process having a first and second path completed by serial combinations of tools for processing of wafers. The method comprises the steps of providing a target value, obtaining a first and second test result of the wafers processed through the first and second path respectively, calculating differences between the first and second test result and the target value to obtain a first and second estimate respectively, and selecting one of the first and second paths according to the estimates.

18 Claims, 2 Drawing Sheets

METHOD AND APPARATUS OF TOOL MATCHING FOR A SEMICONDUCTOR MANUFACTURING PROCESS

BACKGROUND OF THE INVENTION

1. Field of the Invention

The present invention relates to a method and apparatus of tool matching for a semiconductor manufacturing process.

2. Description of the Prior Art

One of the critical factors for success of mass production is yield, defined as the proportion of the number of qualified products to the total number of products. In semiconductor manufacturing, the products are wafers or chips, and the corresponding wafer yield and chip yield are significant. Improvement of the wafer and chip yield reduces the cost and increases production efficiency since most of the wafers or chips are qualified and few are wasted. Therefore, manufacturing engineers are dedicated to the improvement of yield.

Conventionally, for improvement of the yield, engineers choose, from the available tools for each one step or operation in the manufacturing process of a product, the one in the best condition. However, the combination of the selected tools is only a possibly but not absolutely optimized path since the tools are selected individually for each step and correlation between the tools is ignored.

SUMMARY OF THE INVENTION

Therefore, the object of the present invention is to provide a method and apparatus of tool matching for a semiconductor manufacturing process, wherein the correlation between the tools is taken into account so that an absolutely optimized path is provided.

The present invention provides a method of tool matching for a semiconductor manufacturing process having a first and second path completed by serial combinations of tools for processing of wafers. The method comprises the steps of providing a target value, obtaining a first and second test result of the wafers processed through the first and second path respectively, calculating differences between the first and second test result and the target value to obtain a first and second estimate respectively, and selecting one of the first and second path according to the estimates.

The present invention also provides a method of tool matching for a semiconductor manufacturing process having a plurality of paths completed by serial combinations of tools for processing of lots of wafers. The method comprises the steps of providing a target value T, obtaining groups of test results of lots of wafers processed through the paths, calculating a mean value and variation of each group of the test results, wherein the mean value and variation of lot j of the wafers processed through path i are $W(i,j)$ and $\sigma(i,j)$ respectively, providing weights for the lots of the wafers, wherein the weight for lot j of the wafers processed through path i is $R(i,j)$, calculating estimates P of the paths, wherein the estimate of path i using the wafers from $M0_{th}$ to $Mc_{th}$ lot is $$P(i) = \sum_{j=m_o}^{j=m_c} R(i, j)[|W(i, j) - T| + \sigma(i, j)],$$

and selecting one of the paths according to the estimates.

The present invention further provides an apparatus of tool matching for a semiconductor manufacturing process having a first and second path completed by serial combinations of tools for processing of wafers. The apparatus comprises means for providing a target value, means for obtaining a first and second test result of the wafers processed through the first and second path respectively, means for calculating differences between the first and second test result and the target value to obtain a first and second estimate respectively, and means for selecting one of the first and second path according to the estimates.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

In the embodiment of the invention will be described in the following, a manufacturing process comprises four steps S1, S2, S3 and S4. The available tools for the step S1, S2, S3 and S4 are TL(1,1), TL(1,2) and TL(2,1), TL(2,2), TL(2,3), TL(2,4) and TL(3,1), TL(3,2) and TL(4,1), TL(4,2), TL(4,3) respectively. Thus there are 48(2×4×2×3) paths L available.

Figure 1:
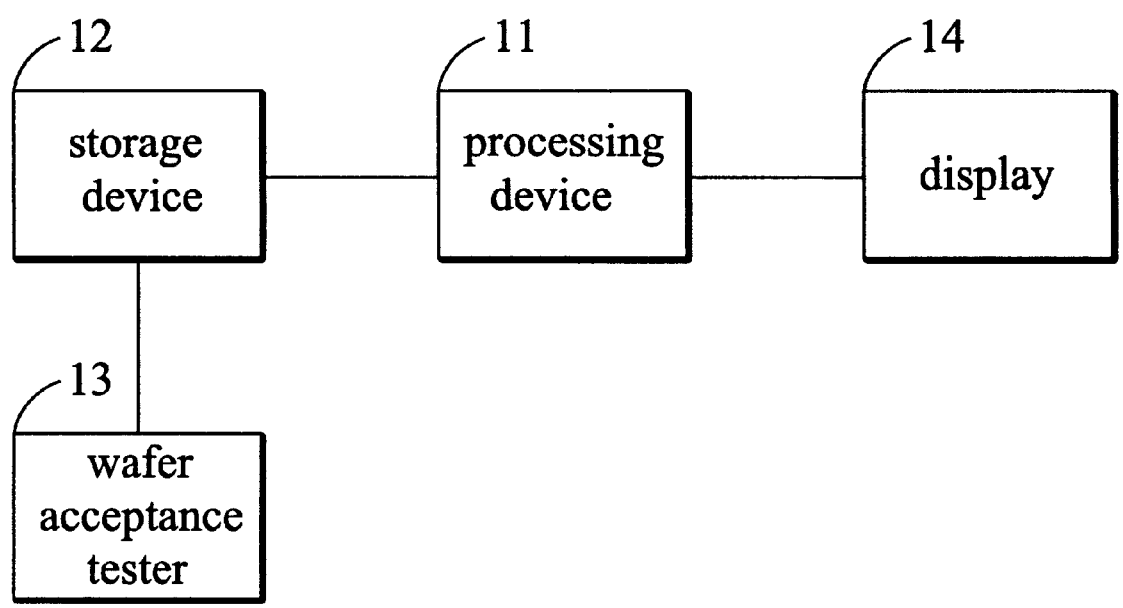
FIG. 1 is a block diagram showing an apparatus of tool matching for a semiconductor manufacturing process according to one embodiment of the invention.

FIG. 1 is a block diagram showing an apparatus of tool matching for a semiconductor manufacturing process according to one embodiment of the invention.

A wafer acceptance tester 13 carries out wafer acceptance tests of lots of wafers processed through the 48 paths L. A group of test results for each one lot of wafers is obtained. The storage device 12 stores the test results of the lots of the wafers indexed to the corresponding paths through which the wafers are processed.

A processing device 11 obtains the test results from the storage device 12 and calculates a mean value W and a variation σ of the test results for each lot of the wafers. A weight R is also provided by the processing device 11 for each lot. The weights R are obtained by Exponential Weighting Moving Average based on the lots. The storage device 12 also stores each of the mean values W and variations σ.

A target value T is provided and sent to the processing device 11. The target value T is the expected value of the test result of the processed wafer.

Then, an estimate P for each path L is calculated by the processing device 11. The estimate P(i) of path i L(i) is $$\sum_{j=m_o}^{j=m_c} R(i, j)[|W(i, j) - T| + \sigma(i, j)],$$

wherein j is the order of the lots processed through the path L(i), Mc is the last lot, M0 is the first lot, $R(i,j)$ is the weight of lot j processed through the path L(i), $W(i,j)$ is the mean value of the test results of lot j processed through the path L(i) and $\sigma(i,j)$ is the variation of the test results of lot j processed through the path L(i).

Finally, the estimates P of the paths L appear on the display 14. The engineers select one path with the smallest estimate, which is the prior choice for accomplishment of the target value.

Additionally, the wafer acceptance tester 13 carries on the tests of the following lots of the wafers so that there are more test results stored in the storage device 12 and the estimates P of the paths L are continually updated.

In the embodiment, the difference [|W(i,j)−T|] and the variation σ(i,j) have an equal weight. However, they may have different weights k1 and k2 for a special estimation, that is to say, the estimate P(i) of path i L(i) is $$\sum_{j=m_O}^{j=m_C} R(i, j)[k1|W(i, j) - T| + k2\sigma(i, j)].$$

Further, the weight R(i,j) is a time-dependent parameter and increases with the order of the lot.

Figure 2:
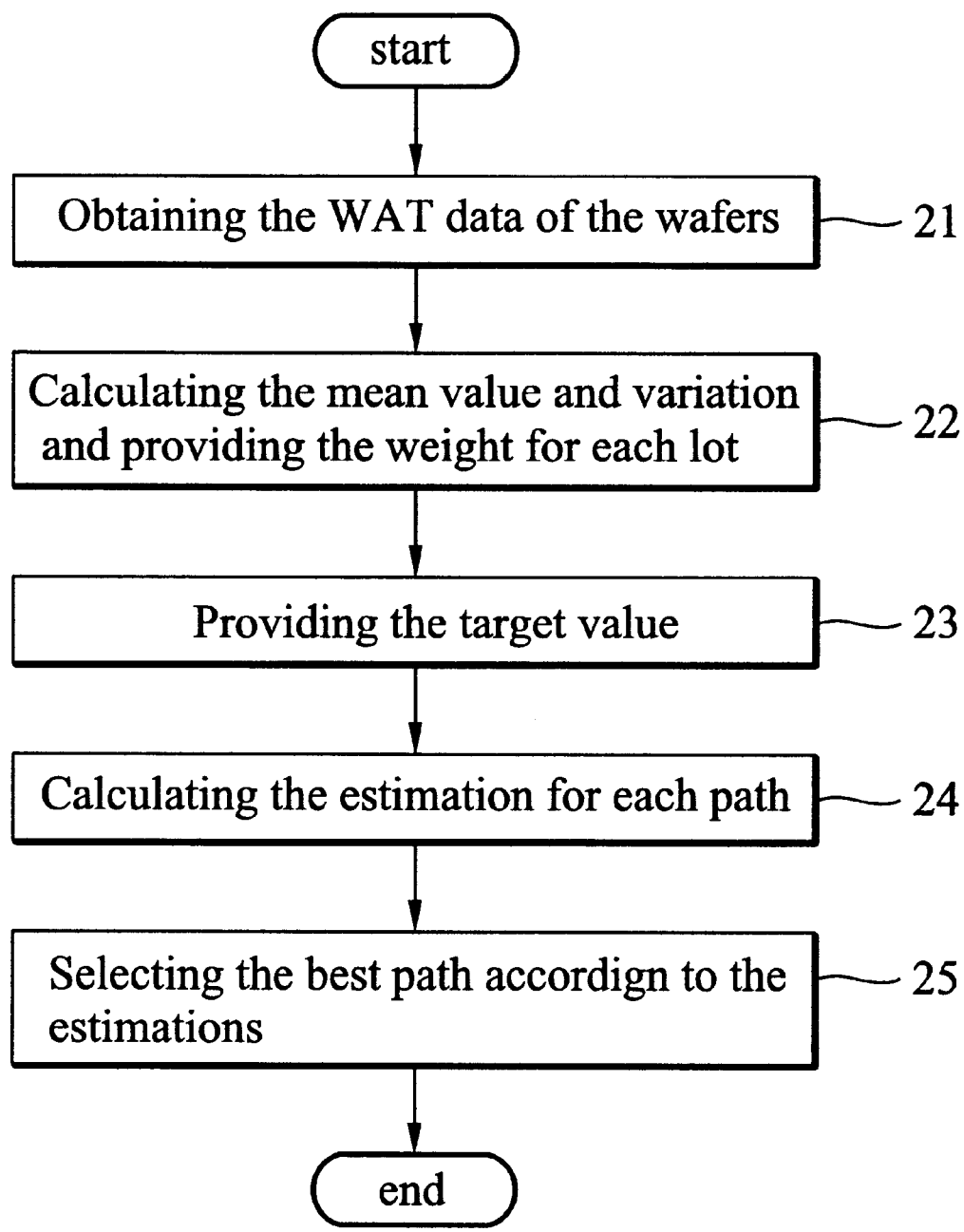
FIG. 2 is a flow chart showing a method of tool matching for a semiconductor manufacturing process according to one embodiment of the invention.

FIG. 2 is a flow chart showing a method of tool matching for a semiconductor manufacturing process according to one embodiment of the invention.

In the embodiment of the invention described here, a manufacturing process comprises four steps S1, S2, S3 and S4. The available tools for the step S1, S2, S3 and S4 are TL(1,1), TL(1,2) and TL(2,1), TL(2,2), TL(2,3), TL(2,4) and TL(3,1), TL(3,2) and TL(4,1), TL(4,2), TL(4,3) respectively. Thus there are 48(2×4×2×3) paths L available.

In step 21, wafer acceptance tests of lots of wafers processed through the 48 paths L are carried out. A group of test results for each lot of wafers is obtained. The test results of the lots of the wafers indexed to the corresponding paths through which the wafers are processed are stored.

In step 22, a mean value W and a variation σ of the test results for each lot of the wafers are obtained. A weight R is also provided for each lot. The weights R are obtained by Exponential Weighting Moving Average based on the lots. Each of the mean values W and variations σ are also stored.

In step 23, A target value T is provided, which is the expected value of the test result of the processed wafer.

In step 24, an estimate P for each path L is calculated. The estimate P(i) of path i L(i) is $$\sum_{j=m_O}^{j=m_C} R(i, j)[|W(i, j) - T| + \sigma(i, j)],$$

wherein j is the order of the lots processed through the path L(i), Mc is the last lot, M0 is the first lot, R(i,j) is the weight of lot j processed through the path L(i), W(i,j) is the mean value of the test results of lot j processed through the path L(i) and σ(i,j) is the variation of the test results of lot j processed through the path L(i).

Finally, in step 25, the estimates P of the paths L are listed. The engineers select one path with the smallest estimate, which is the prior choice for accomplishment of the target value.

Additionally, the tests of the following lots of the wafers are carried out so that there are more test results generated and the estimates P of the paths L are continually updated.

In conclusion, the present invention provides a tool matching method wherein the wafer acceptance test results are stored in a continually updated database, a weight is assigned to each lot of the wafers and the performances of the available paths are statistically estimated using the database. Thus, a quantified estimate is provided for tool matching for a semiconductor manufacturing process.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of tool matching for a semiconductor manufacturing process having a first and second path completed by serial combinations of tools for processing of wafers, the method comprising the steps of:

providing a target value;

obtaining a first and second test result of the wafers processed through the first and second path respectively;

calculating differences between the first and second test result and the target value to obtain a first and second estimate respectively; and selecting one of the first and second path according to the estimates.

2. The method as claimed in claim 1 wherein the first test result is a mean value of results obtained by carrying out a wafer acceptance test of a lot of the wafers processed through the first path.

3. The method as claimed in claim 1 wherein the second test result is a mean value of results obtained by carrying out a wafer acceptance test of a lot of the wafers processed through the second path.

4. The method as claimed in claim 1 further comprising the steps of:

obtaining variations of the first and second test result; and calculating sums of the differences from the target value and variations of the first and second test result to obtain the first and second estimates.

5. The method as claimed in claim 4 wherein the first test result and the variation thereof are respectively a mean value and a variation of results obtained by carrying out a wafer acceptance test of a lot of the wafers processed through the first path.

6. The method as claimed in claim 4 wherein the second test result and the variation thereof are respectively a mean value and a variation of results obtained by carrying out a wafer acceptance test of a lot of the wafers processed through the second path.

7. The method as claimed in claim 4 wherein differences and variations have different weights.

8. The method as claimed in claim 1 further comprising the steps of:

obtaining a third and fourth test result of the first and second path respectively;

providing a first, second, third and fourth weight of the first, second, third and fourth test result respectively; and calculating sums of the products of the weights and the differences between the test results and the target value to obtain the first and second estimates.

9. The method as claimed in claim 8 wherein the weights are time-dependent parameters and increase with an order of lots of the wafers.

10. The method as claimed in claim 1 wherein one of the first and second path with the smaller estimate is a prior choice for accomplishment of the target value.

11. A method of tool matching for a semiconductor manufacturing process having a plurality of paths completed by serial combinations of tools for processing of lots of wafers, the method comprising the steps of:

providing a target value T;

obtaining groups of test results of lots of wafers processed through the paths;

calculating a mean value and variation of each group of the test results, wherein the mean value and variation of lot j of the wafers processed through path i are W(i,j) and σ(i,j) respectively;

providing weights for the lots of the wafers, wherein the weight for lot j of the wafers processed through path i is R(i,j);

calculating estimates P of the paths, wherein the estimate of path i using the wafers from $M0_{th}$ to $Mc_{th}$ lot is $$P(i) = \sum_{j=m_o}^{j=m_c} R(i, j)[|W(i, j) - T| + \sigma(i, j)];$$

and selecting one of the paths according to the estimates.

12. The method as claimed in claim 11 further comprises the steps of:

providing weights k1 and k2; and calculating estimates P of the paths, wherein the estimate of path i using the wafers from $M0_{th}$ to $Mc_{th}$ lot is $$P(i) = \sum_{j=m_o}^{j=m_c} R(i, j)[k1|W(i, j) - T| + k2\sigma(i, j)].$$

13. The method as claimed in claim 11 wherein the weights R(i,j) increase with an order of the lots of the wafers.

14. A method for determining an optimized path for a semiconductor manufacturing process, the method comprising the steps of:

providing a first path completed by serial combinations of tools for processing of wafers;

providing a second path completed by serial combinations of tools for processing of wafers;

providing a target value;

obtaining a first test result and a second test result of the wafers processed through the first path and the second path respectively;

calculating differences between the first test result and the target value to obtain a first estimate;

calculating differences between the second test result and the target value to obtain a second estimate; and selecting one of the first path and the second path by comparing the first estimate with the second estimate.

15. The method as claimed in claim 14, wherein the first test result is a mean value of results obtained by carrying out a wafer acceptance test of a plurality of wafers processed through the first path.

16. The method as claimed in claim 14, wherein the second test result is a mean value of results obtained by carrying out a wafer acceptance test of a plurality of wafers processed through the second path.

17. The method as claimed in claim further comprising the steps of:

obtaining variations of the first test result and the second test result; and calculating sums of the differences from the target value and variations of the first test result and the second test result to obtain the first estimate and the second estimate.

18. The method as claimed in claim 14, further comprising the steps of:

obtaining a third and fourth test result of the first path and the second path, respectively;

providing a first, second, third and fourth weights of the first, second, third and fourth test results respectively; and calculating sums of the products of the weights and the differences between the test results and the target value to obtain the first and second estimates.

* * * * *